US012749891B2

(12) United States Patent
Qu et al.

(10) Patent No.: US 12,749,891 B2
(45) Date of Patent: Sep. 29, 2026

(54) PROTECTION UNIT, ADC MODULE AND SYSTEM

(71) Applicant: ABB Schweiz AG, Baden (CH)

(72) Inventors: Yongfei Qu, Hangzhou (CN); Huan Shi, Hangzhou (CN); Wei Liu, Hangzhou (CN); Jie Yuan, Hangzhou (CN)

(73) Assignee: ABB SCHWEIZ AG, Baden (CH)

( * ) Notice: Subject to any disclaimer, the term of this patent is extended or adjusted under 35 U.S.C. 154(b) by 299 days.

(21) Appl. No.: 18/300,993

(22) Filed: Apr. 14, 2023

(65) Prior Publication Data

US 2023/0369850 A1 Nov. 16, 2023

(30) Foreign Application Priority Data

May 12, 2022 (CN) ......................... 202210520534.1

(51) Int. Cl.

| | |
|---|---|
| ***H02H 9/04*** | (2006.01) |
| ***H02H 3/20*** | (2006.01) |
| ***H03K 17/0812*** | (2006.01) |

(52) U.S. Cl.

CPC .............. *H02H 9/046* (2013.01); *H02H 3/20* (2013.01); *H03K 17/08122* (2013.01)

(58) Field of Classification Search

CPC ..... H02H 9/046; H02H 3/20; H03K 17/08122
USPC ............................................................ 361/56
See application file for complete search history.

(56) References Cited

U.S. PATENT DOCUMENTS

| | | | | |
|---|---|---|---|---|
| 5,463,261 | A * | 10/1995 | Skarda | G06F 1/3215 361/740 |
| 11,860,599 | B2 * | 1/2024 | Denning | H02J 1/108 |
| 12,034,000 | B2 * | 7/2024 | Stockinger | H02H 9/046 |
| 2013/0250468 | A1 | 9/2013 | Miyazaki | |
| 2017/0196053 | A1 * | 7/2017 | Chen | H05B 45/56 |
| 2020/0365346 | A1 * | 11/2020 | Telefus | H02M 1/32 |
| 2021/0167813 | A1 | 6/2021 | Arduini | |

FOREIGN PATENT DOCUMENTS

CN 109449905 A 3/2019

OTHER PUBLICATIONS

PXIe-4310 Specification, National Instruments (Year: 2017).*

* cited by examiner

*Primary Examiner* — Crystal L Hammond
*Assistant Examiner* — Samantha L Faubert
(74) *Attorney, Agent, or Firm* — Greenberg Traurig, LLP; Vishak Ganesh

(57) ABSTRACT

Embodiments of present disclosure relate to a protection unit, an ADC module, and a system. The protection unit includes a first terminal; a second terminal; a first switch unit disposed between the first terminal and an output terminal of the protection unit; a second switch unit disposed between the second terminal and a ground of the protection unit; and a positive over voltage protection unit coupled to the first terminal, the first switch unit, and the second switch unit. The protection unit is configured to switch off the first switch unit and the second switch unit when a positive voltage at the first terminal exceeds a positive threshold.

20 Claims, 4 Drawing Sheets

PROTECTION UNIT, ADC MODULE AND SYSTEM

CROSS-REFERENCE TO RELATED APPLICATIONS

This application claims priority to Chinese patent application Serial No.: 202210520534.1, filed on May 12, 2022; which is herein incorporated by reference in its entirety.

FIELD

Embodiments of the present disclosure generally relate to the field of protection unit, ADC module and system, and more particularly, to a protection unit, an ADC module and a system used in Explosion Hazardous Areas.

BACKGROUND

Hot swappable Analog-Digital Converter (ADC) modules are widely used in various kinds of industry fields for measurements. When those modules are used in Explosion Hazardous Areas, for example, in Zone 2, they are required to meet the explosion (EX) protection requirements and withstand a high voltage. The existing EX protection circuits generally use resistors to limit the current flows into the ADC module, and the value of resistors are usually very large. The large resistance will cause unacceptable errors of the ADC. In a case where the measurement requires a excitation current, for example, the Resistance Temperature Detector (RTD) measurement, a large resistance will require a larger voltage to supply power to a current source, which will bring more trouble to the EX protection.

SUMMARY

In view of the foregoing problems, various example embodiments of the present disclosure provide a protection unit used in the ADC module which enable the ADC module to meet the EX protection requirements and withstand a high voltage without using large resistors, thereby increasing the measurement accuracy of the ADC module.

In a first aspect of the present disclosure, example embodiments of the present disclosure provide a protection unit. The protection unit comprises a first terminal; a second terminal; a first switch unit disposed between the first terminal and an output terminal of the protection unit; a second switch unit disposed between the second terminal and a ground of the protection unit; and a positive over voltage protection unit coupled to the first terminal, the first switch unit, and the second switch unit, and configured to switch off the first switch unit and the second switch unit when a positive voltage at the first terminal exceeds a positive threshold. With these embodiments, the protection unit can cut off the connection between the first terminal and the output terminal when an over voltage is applied to the first terminal, which can protect an ADC IC connected to the protection unit.

In some embodiments, the protection unit further comprises a negative over voltage protection unit coupled to the first terminal, the second terminal, the first switch unit, and the second switch unit, and configured to switch off the first switch unit and the second switch unit when a negative voltage at the first terminal exceeds a negative threshold. With these embodiments, the protection unit can protect the ADC IC regardless the over voltage is positive or negative.

In some embodiments, the protection unit further comprises a hot swap unit coupled to the first switch unit and the second switch unit, and configured to switch off the first switch unit and the second switch unit when the protection unit is hot-inserted into or hot-removed from a board card. With these embodiments, the ADC module can be hot-inserted into or hot-removed from the board card while meets the EX protection requirements.

In some embodiments, the protection unit further comprises an Electronic Static Discharge (ESD) circuit arranged at the output terminal and comprising a first diode and a second diode connected in series between the ground and a first power supply. With these embodiments, the safety of the ADC IC can be further improved.

In some embodiments, the first switch unit comprises a first MOSFET, and the second switch unit comprises a second MOSFET, wherein the first MOSFET comprises a source coupled to the output terminal, a gate coupled to the positive over voltage protection unit, and a drain coupled to the first terminal through a first resistor, and wherein the second MOSFET comprises a source coupled to the ground, a gate coupled to the positive over voltage protection unit, and a drain coupled to the second terminal. With these embodiments, the first switch unit and the second switch unit can be achieved in a cost effective manner.

In some embodiments, the positive over voltage protection unit comprises a third diode, a first PNP transistor, a first NPN transistor, a second resistor, and a third resistor, wherein an anode of the third diode is coupled to a point between the first resistor and the first terminal, a cathode of the third diode is coupled to a first terminal of the second resistor and a first terminal of the third resistor, a second terminal of the second resistor is coupled to an emitter of the first PNP transistor, a second terminal of the third resistor is coupled to a base of the first PNP transistor and the first power supply, a collector of the first PNP transistor is coupled to a base of the first NPN transistor, a collector of the first NPN transistor is coupled to the gate of the first MOSFET and the gate of the second MOSFET, an emitter of the first NPN transistor is coupled to the ground. With these embodiments, the positive over voltage protection unit can be achieved in a cost effective manner and the MOSFETs can be turned off reliably.

In some embodiments, the negative over voltage protection unit comprises a fourth diode, a second NPN transistor, a third NPN transistor, a second PNP transistor, a third PNP transistor, a fourth resistor, a fifth resistor, a sixth resistor, a seventh resistor, an eighth resistor, wherein a cathode of the fourth diode is coupled to a point between the first resistor and the first terminal, an anode of the fourth diode is coupled to a first terminal of the fourth resistor and a first terminal of the fifth resistor, a second terminal of the fourth resistor is coupled to a base of the second NPN transistor and a collector of the second PNP transistor, a second terminal of the fifth resistor is coupled to an emitter of the second NPN transistor, a collector of the second NPN transistor is coupled to a first terminal of the sixth resistor and a base of the second PNP transistor, an emitter of the second PNP transistor is coupled to the gate of the first MOSFET and the gate of the second MOSFET, the collector of the second PNP transistor is coupled to the ground, wherein a first terminal of the seventh resistor and a first terminal of the eighth resistor are coupled to the drain of the second MOSFET, a second terminal of the seventh resistor is coupled to an emitter of the third PNP transistor, a second terminal of the eighth resistor is coupled to a base of the third PNP transistor and the first power supply, a collector of the third PNP transistor is coupled to a base of the third NPN transistor, a collector of the third NPN transistor is coupled to the gate of the first MOSFET and the gate of the second MOSFET, an emitter of the third NPN transistor is coupled to the ground. With these embodiments, the negative over voltage protection unit can be achieved in a cost effective manner and the MOSFETs can be turned off reliably.

In some embodiments, the hot swap unit comprises a switch, a fourth NPN transistor, a ninth resistor, a tenth resistor, and a eleventh resistor, wherein a first terminal of the switch is coupled to the ground, a second terminal of the switch is coupled to a first terminal of the ninth resistor and a first terminal of the tenth resistor, a second terminal of the ninth resistor is coupled to a base of the fourth NPN transistor, a second terminal of the tenth resistor is coupled to a first terminal of the eleventh resistor and a second power supply, a second terminal of the eleventh resistor is coupled to a collector of the fourth NPN transistor, the gate of the first MOSFET and the gate of the second MOSFET, an emitter of the fourth NPN transistor is coupled to the ground, wherein the switch is turned off when the protection unit is being hot inserted or hot removed. With these embodiments, the hot swap unit can be achieved in a cost effective manner.

In some embodiments, the switch is controlled by a mechanical component, and configured to: be turned off when the mechanical component is positioned at a first position, to allow the protection unit to be inserted into or removed from the board card, and be turned on when the mechanical component is positioned at a second position to prevent the protection unit from being inserted into or removed from the board card. With these embodiments, the safety of the ADC IC can be further improved.

In some embodiments, the protection unit further comprises a current limiting unit at the first terminal. With these embodiments, the current flowing into the protection unit can be limited, thereby the safety of the ADC IC can be further improved.

In a second aspect of the present disclosure, example embodiments of the present disclosure provide an ADC module. The ADC module comprises a protection unit according to any of above embodiments; and an IC coupled to the output terminal and the ground and configured to convert an analog signal between the first terminal and the second terminal into a digital signal.

In a third aspect of the present disclosure, example embodiments of the present disclosure provide a system. The system comprises a measurement module comprising at least one ADC module according to any of above embodiments, the measurement module is configured to measure analog signals in Explosion Hazardous Areas; a controller coupled to the measurement module and configured to issue control signals based on measured analog signals; and a communication interface coupled to the controller and configured to provide a communicate path for the controller and other devices in the system.

It is to be understood that the Summary section is not intended to identify key or essential features of embodiments of the present disclosure, nor is it intended to be used to limit the scope of the present disclosure. Other features of the present disclosure will become easily comprehensible through the following description.

DESCRIPTION OF DRAWINGS

Through the following detailed descriptions with reference to the accompanying drawings, the above and other objectives, features and advantages of the example embodiments disclosed herein will become more comprehensible. In the drawings, several example embodiments disclosed herein will be illustrated in examples and in a non-limiting manner, wherein.

Throughout the drawings, the same or similar reference symbols are used to indicate the same or similar elements.

DETAILED DESCRIPTION OF EMBODIMENTS

Figure 1:
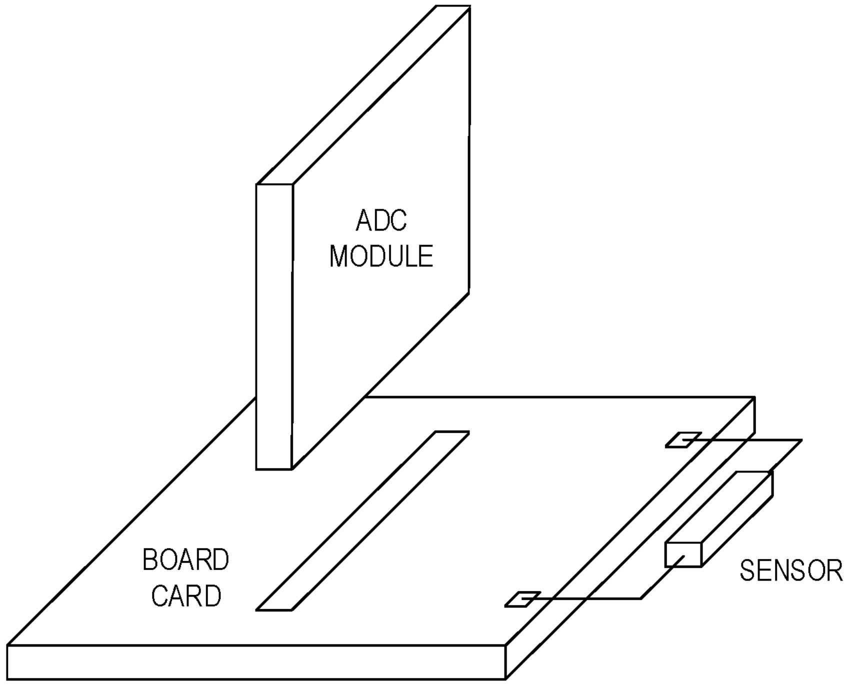
FIG. 1 is a schematic view illustrating an operating environment of a hot swappable ADC module.

Principles of the present disclosure will now be described with reference to several example embodiments shown in the drawings. Though example embodiments of the present disclosure are illustrated in the drawings, it is to be understood that the embodiments are described only to facilitate those skilled in the art to better understand and thereby implement the present disclosure, rather than to limit the scope of the disclosure in any manner.

The term "comprises" or "includes" and its variants are to be read as open terms that mean "includes, but is not limited to." The term "or" is to be read as "and/or" unless the context clearly indicates otherwise. The term "based on" is to be read as "based at least in part on." The term "being operable to" is to mean a function, an action, a motion or a state that can be achieved by an operation induced by a user or an external mechanism. The term "one embodiment" and "an embodiment" are to be read as "at least one embodiment." The term "another embodiment" is to be read as "at least one other embodiment." The terms "first," "second," and the like may refer to different or same objects. Other definitions, explicit and implicit, may be included below. A definition of a term is consistent throughout the description unless the context clearly indicates otherwise.

Hereinafter, an operating environment of a hot swappable ADC module and the defects of existing ADC module will be described in detail with reference to FIGS. 1-2. Refer to FIG. 1 first. FIG. 1 is a schematic view illustrating an operating environment of a hot swappable ADC module.

As shown in FIG. 1, a temperature sensor is used to measure the temperature parameter. The temperature sensor may be a 2-wire RTD, a 3-wire RTD, a 4-wire RTD, or a thermocouple. The temperature sensor is coupled to a board card through connectors, which allows the temperature sensor to be replaceable. An ADC module can be inserted into or removed from a slot disposed on the board card, which allows the ADC module to be replaceable. The board card electrically connects the temperature sensor to the ADC module. As a result, the analog signal measured at the temperature sensor is provided to the ADC module, and the analog signal is converted to a digital signal in the ADC module.

When the ADC module is used in an Explosion Hazardous Areas, the ADC module is required to meet the explosion (EX) protection requirements when it is inserted into or removed from the board card. Moreover, if the connector is misconnected to a high voltage when replacing the temperature sensor, the ADC module is required to withstand the high voltage.

Figure 2:
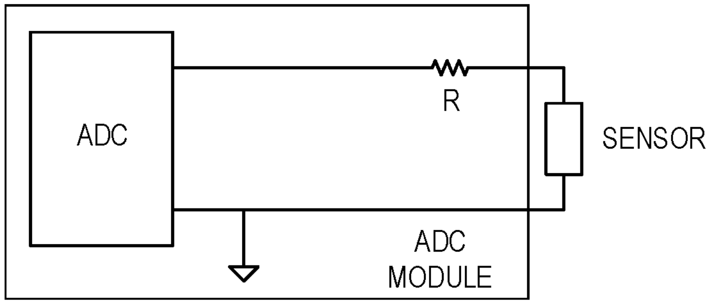
FIG. 2 is a schematic view illustrating an existing ADC module.

FIG. 2 is a schematic view illustrating an existing ADC module. As shown in FIG. 2, the existing ADC module generally uses resistor R to limit the current flows into the ADC module. In order to meet the requirements of the EX protection and withstand a high voltage, the value of resistors are usually very large. As a result, the large resistance will cause unacceptable errors of the ADC.

For RTD measurements, they usually need excitation current. When the existing ADC module is used with the RTD, the large resistance will require a larger voltage to supply power to the current source, which will bring more trouble to the EX protection.

Figure 3:
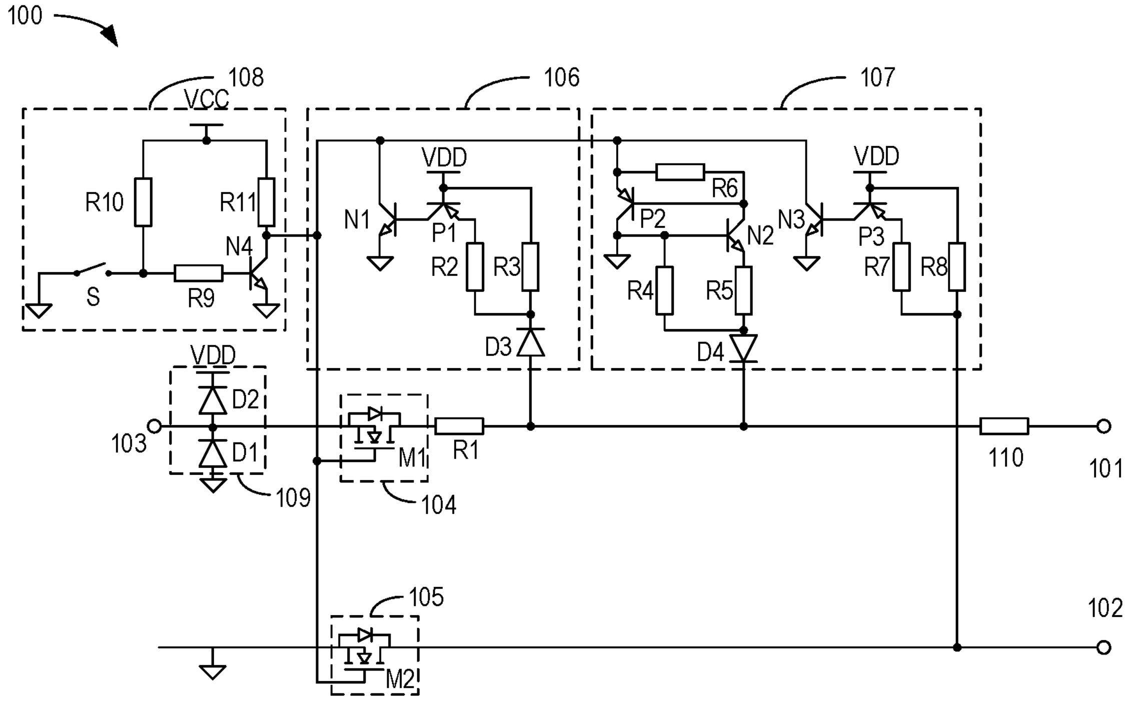
FIG. 3 is a schematic view illustrating an protection unit in accordance with an embodiment of the present disclosure.

Hereinafter, the structure of a protection unit in accordance with an embodiment of the present disclosure will be described in detail with reference to FIGS. 3-5. Refer to FIG. 3 first. FIG. 3 is a schematic view illustrating a protection unit in accordance with an embodiment of the present disclosure.

As shown in FIG. 3, the protection unit 100 comprises a first terminal 101, a second terminal 102, an output terminal 103, a first switch unit 104, a second switch unit 105 and a positive over voltage protection unit 106.

Figure 4:
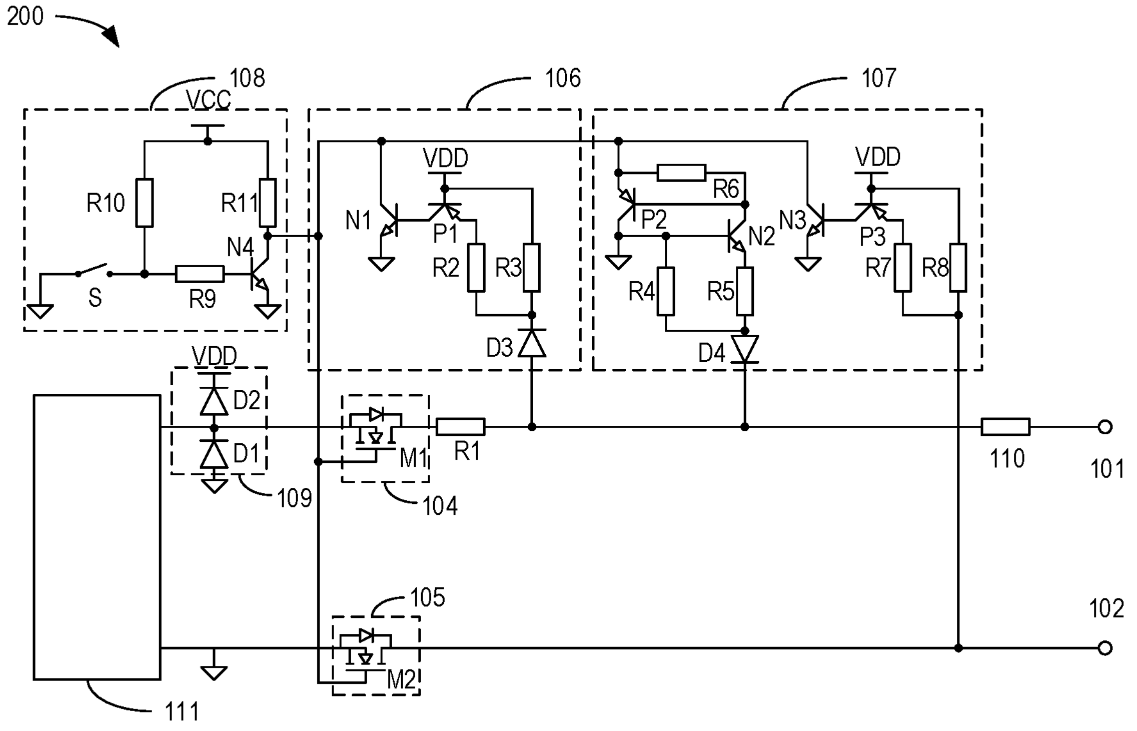
FIG. 4 is a schematic view illustrating an ADC module in accordance with an embodiment of the present disclosure.

FIG. 4 is a schematic view illustrating an ADC module in accordance with an embodiment of the present disclosure. As shown in FIG. 4, the ADC module 200 comprises a protection unit 100 according to any of previous embodiments and an ADC IC 111. The ADC IC 111 is coupled to the output terminal 103 and the ground and configured to convert an analog signal between the first terminal 101 and the second terminal 102 into a digital signal.

The first terminal 101 and the second terminal 102 are used to electrically couple the output terminal 103 to the temperature sensor which is outside the protection unit. The temperature signal between the first terminal 101 and the second terminal 102 is an analog signal. The output terminal 103 is used to output the analog signal to the ADC IC.

The ADC IC is configured to convert the analog signal into a digital signal. The ADC IC comprises a plurality of pins for inputting and outputting signals.

The first switch unit 104 is disposed between the first terminal 101 and the output terminal 103, and the second switch unit 105 is disposed between the second terminal 102 and a ground of the protection unit 100. The first switch unit 104 and the second switch unit 105 are used to control the connection between the output terminal 103 and the first terminal 101 and the connection between the ground and the second terminal 102 respectively. The ground of the protection unit 100 is connected to the ground of the ADC IC 111.

The positive over voltage protection unit 106 is coupled to the first terminal 101, the first switch unit 104, and the second switch unit 105. The positive over voltage protection unit 106 is configured to switch off the first switch unit 104 and the second switch unit 105 when a positive voltage at the first terminal 101 exceeds a positive threshold.

With above structure, when an over voltage is applied at the first terminal 101 when replacing the temperature sensor, the connections between the output terminal 103 and the first terminal 101 is cut off. As a result, the ADC module can withstand a high voltage without using large resistors, thereby increasing the safety of the ADC module.

As shown in FIG. 3, the protection unit 100 further comprises a negative over voltage protection unit 107 coupled to the first terminal 101, the second terminal 102, the first switch unit 104, and the second switch unit 105. The negative over voltage protection unit 107 is configured to turn off the first switch unit 104 and the second switch unit 105 when a negative voltage at the first terminal 101 exceeds a negative threshold.

With above structure, a positive high voltage and a negative high voltage are both prevented from applied to the ADC IC 111. As a result, the ADC module can withstand a high voltage regardless the voltage is positive or negative, thereby the safety of the ADC module is further improved.

As shown in FIG. 3, the protection unit 100 further comprises a hot swap unit 108 coupled to the first switch unit 104 and the second switch unit 105. The hot swap unit 108 is configured to switch off the first switch unit 104 and the second switch unit 105 when the ADC module 200 is hot-inserted into or hot-removed from the board card.

With above structure, during the hot-inserting or the hot-removing of the ADC module, the connection between the output terminal 103 and the first terminal 101 and the connection between the ground and the second terminal 102 are cut off, and there will be no spark, because there is no voltage or current at these terminals. As a result, the EX protection requirements is satisfied.

In the embodiment as shown in FIG. 3, the protection unit 100 further comprises an Electronic Static Discharge ESD circuit 109 arranged at the output terminal and comprising a first diode D1 and a second diode D2 connected in series between the ground and a first power supply VDD.

As shown in FIG. 3, an anode of the first diode D1 is connected to the ground, a cathode of the first diode D1 is connected to an anode of the second diode D2 and the output terminal, and a cathode of the second diode D2 is connected to a first power supply VDD.

In other embodiments, the ESD circuit 109 can comprise other elements. The scope of the present disclosure is not intended to be limited in this respect.

In the embodiment as shown in FIG. 3, the first switch unit 104 comprises a first MOSFET M1, and the second switch unit 105 comprises a second MOSFET M2. The first MOSFET M1 comprises a source coupled to the output terminal, a gate coupled to the positive over voltage protection unit 106, and a drain coupled to the first terminal 101 through a first resistor R1. The second MOSFET M2 comprises a source coupled to the ground, a gate coupled to the positive over voltage protection unit 106, and a drain coupled to the second terminal 102. The first MOSFET M1 and the second MOSFET M2 comprises a body diode respectively.

In other embodiments, the first switch unit 104 and the second switch 105 can comprise other elements. The scope of the present disclosure is not intended to be limited in this respect.

In the embodiment as shown in FIG. 3, the positive over voltage protection unit 106 comprises a third diode D3, a first PNP transistor P1, a first NPN transistor N1, a second resistor R2, and a third resistor R3.

As shown in FIG. 3, an anode of the third diode D3 is coupled to a point between the first resistor R1 and the first terminal 101. A cathode of the third diode D3 is coupled to a first terminal of the second resistor R2 and a first terminal of the third resistor R3. A second terminal of the second resistor R2 is coupled to an emitter of the first PNP transistor P1. A second terminal of the third resistor R3 is coupled to a base of the first PNP transistor P1 and the first power supply VDD. A collector of the first PNP transistor P1 is coupled to a base of the first NPN transistor N1. A collector of the first NPN transistor N1 is coupled to the gate of the first MOSFET M1 and the gate of the second MOSFET M2. An emitter of the first NPN transistor N1 is coupled to the ground.

In other embodiments, the positive over voltage protection unit 106 can comprise other elements. The scope of the present disclosure is not intended to be limited in this respect.

In the embodiment as shown in FIG. 3, the negative over voltage protection unit 107 comprises a fourth diode D4, a second NPN transistor N2, a third NPN transistor N3, a second PNP transistor P2, a third PNP transistor P3, a fourth resistor R4, a fifth resistor R5, a sixth resistor R6, a seventh resistor R7, an eighth resistor R8.

As shown in FIG. 3, a cathode of the fourth diode D4 is coupled to a point between the first resistor R1 and the first terminal 101. An anode of the fourth diode D4 is coupled to a first terminal of the fourth resistor R4 and a first terminal of the fifth resistor R5. A second terminal of the fourth resistor R4 is coupled to a base of the second NPN transistor N2 and a collector of the second PNP transistor P2. A second terminal of the fifth resistor R5 is coupled to an emitter of the second NPN transistor N2. A collector of the second NPN transistor N2 is coupled to a first terminal of the sixth resistor R6 and a base of the second PNP transistor P2. An emitter of the second PNP transistor P2 is coupled to the gate of the first MOSFET M1 and the gate of the second MOSFET M2. The collector of the second PNP transistor P2 is coupled to the ground.

As shown in FIG. 3, a first terminal of the seventh resistor R7 and a first terminal of the eighth resistor R8 are coupled to the drain of the second MOSFET M2. A second terminal of the seventh resistor R7 is coupled to an emitter of the third PNP transistor P3. A second terminal of the eighth resistor R8 is coupled to a base of the third PNP transistor P3 and the first power supply VDD. A collector of the third PNP transistor P3 is coupled to a base of the third NPN transistor N3. A collector of the third NPN transistor N3 is coupled to the gate of the first MOSFET M1 and the gate of the second MOSFET M2. An emitter of the third NPN transistor N3 is coupled to the ground.

In other embodiments, the negative over voltage protection unit 107 can comprise other elements. The scope of the present disclosure is not intended to be limited in this respect.

In the embodiment as shown in FIG. 3, the hot swap unit 108 comprises a switch S, a fourth NPN transistor N4, a ninth resistor R9, a tenth resistor R10, and a eleventh resistor R11.

As shown in FIG. 3, a first terminal of the switch S is coupled to the ground. A second terminal of the switch S is coupled to a first terminal of the ninth resistor R9 and a first terminal of the tenth resistor R10. A second terminal of the ninth resistor R9 is coupled to a base of the fourth NPN transistor N4. A second terminal of the tenth resistor R10 is coupled to a first terminal of the eleventh resistor R11 and a second power supply VCC. A second terminal of the eleventh resistor R11 is coupled to a collector of the fourth NPN transistor N4, the gate of the first MOSFET M1 and the gate of the second MOSFET M2. An emitter of the fourth NPN transistor N4 is coupled to the ground. The switch S is turned off during the hot inserting or hot removing of the ADC module 200.

In some embodiment, the hot swap unit 108 further comprises a mechanical component. When the mechanical component is positioned at a first position, the ADC module 200 can be inserted into or removed from the board card. When the mechanical component is positioned at a second position, the ADC module 200 are prevented from being inserted into or removed from the board card.

The switch S is controlled by the mechanical component. When the mechanical component is positioned at the first position, the switch S is turned off. When the mechanical component is positioned at the second position, the switch S is turned on.

With above structure, a connection between the switch S and the mechanical component is established, and the safety of the ADC module can be further improved.

In other embodiments, the hot swap unit 108 can comprise other elements. The scope of the present disclosure is not intended to be limited in this respect.

In the embodiment as shown in FIG. 3, the protection unit further comprises a current limiting unit 110 at the first terminal 101 to limit the current flowing into the ADC module. As a result, the safety of the ADC module can be further improved.

In some embodiments, the current limiting unit 110 is a low value resistor. In other embodiments, the current limiting unit 110 can comprise other elements. The scope of the present disclosure is not intended to be limited in this respect.

Referring to FIG. 4, the operating principle of the ADC module is described as follows.

When the ADC module 200 is inserted into the board card or removed from the board cart, the switch S in the hot swap unit 108 is turned off. In this situation, N4 is turned on, and the gates of M1 and M2 are connected to the ground. As a result, M1 and M2 are turned off, and there is no voltage or current at the terminal 101 or 102. Therefore, there will no spark during the inserting or removing of the ADC module, and the EX protection requirements is satisfied After the ADC module is inserted in the board card, when a positive high voltage is misapplied at the first terminal 101 during a replacing of the temperature sensor, the positive high voltage, which is higher than VDD, is applied to the emitter of P1 via D3. In this situation, P1 is turned on, and N1 is turned on accordingly. As a result, the gates of M1 and M2 are connected to the ground, and M1 and M2 are turned off. Therefore, the positive high voltage is prevented from being applied to the ADC IC 111.

When a negative high voltage is misapplied at the first terminal 101, the voltage between the base and the emitter of N2 is high, and N2 is turned on, which makes the voltage between the emitter and the base of P2 high and P2 is turned on. As a result, the gates of M1 and M2 are connected to the ground, and M1 and M2 are turned off.

After M1 and M2 are turned off, a current is flowing from the second terminal 102, through M2, ground, D1, body diode of M1, R1, to the first terminal 101. In this situation, the voltage on the cathode of D4 changes to a value near to zero, and N2 may be turned off. As a result, M1 and M2 may be turned on again.

To make M1 and M2 be turned off reliably during the applying of the negative high voltage on the first terminal 101, additional components are needed. As shown in FIG. 3, after M1 and M2 are turned off, a current is flowing from the second terminal 102, through M2, ground, D1, body diode of M1, R1, to the first terminal 101. In this situation, the voltage at the second terminal 102 changes to a high value due to the high resistance state of M2. As a result, the high voltage, which is higher than VDD, is applied to the emitter of P3. In this situation, P3 is turned on, and N3 is turned on accordingly. As a result, the gates of M1 and M2 are connected to the ground, and M1 and M2 are turned off. Therefore, the negative high voltage is prevented from being applied to the ADC IC 111.

Figure 5:
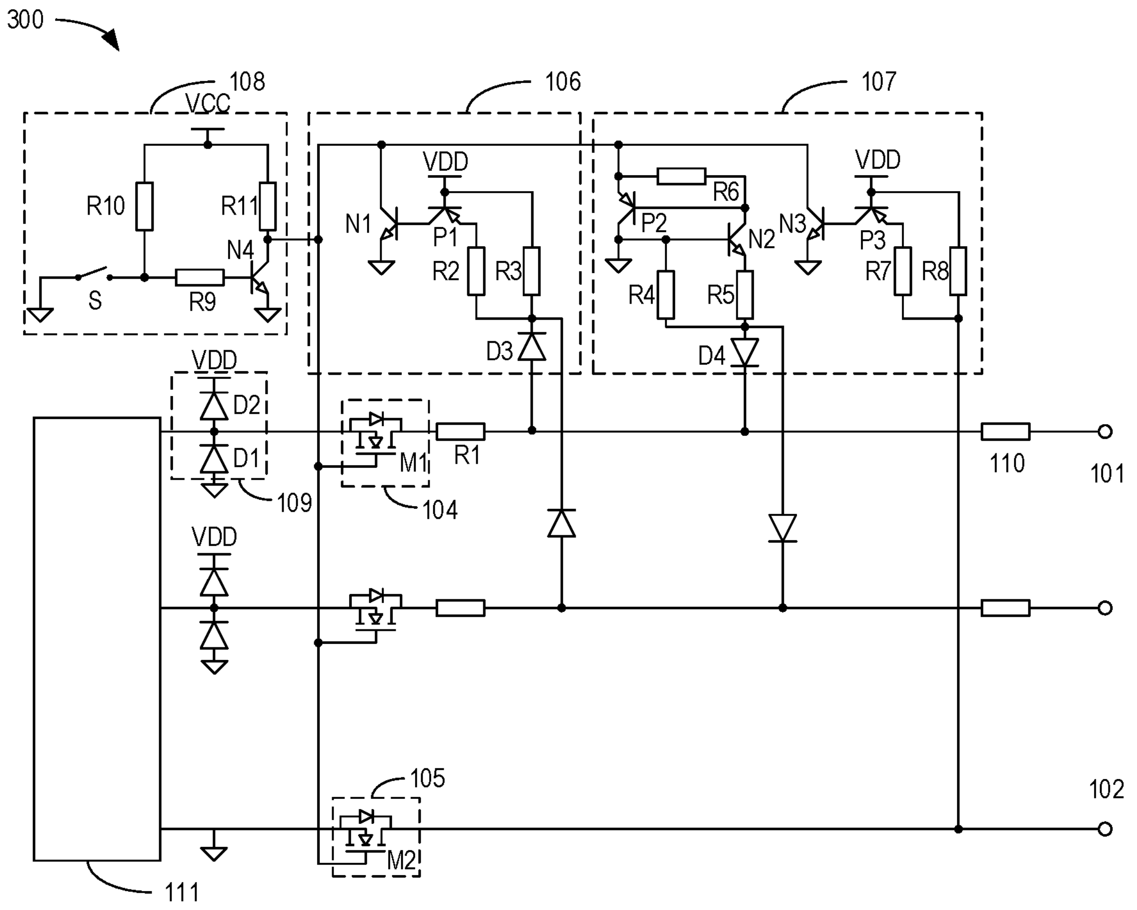
FIG. 5 is a schematic view illustrating an ADC module in accordance with another embodiment of the present disclosure.

Referring to FIG. 5, FIG. 5 is a schematic view illustrating an ADC module 300 in accordance with another embodiment of the present disclosure.

In the embodiment as shown in FIG. 5, there is another input path between another terminal and the ADC IC 111. The structure of this path is same as the input path connected to the first terminal 101, and this path is connected to the positive high voltage protection unit 106 and the negative high voltage protection unit 107 through diodes, same as the input path connected to the first terminal 101. As a result, the high voltage at the terminal connected to this path is also prevented from being applied to the ADC IC 111.

In other embodiments, the ADC module may comprises more than 2 input paths according to the terminals required by the temperature sensor. The scope of the present disclosure is not intended to be limited in this respect.

Figure 6:
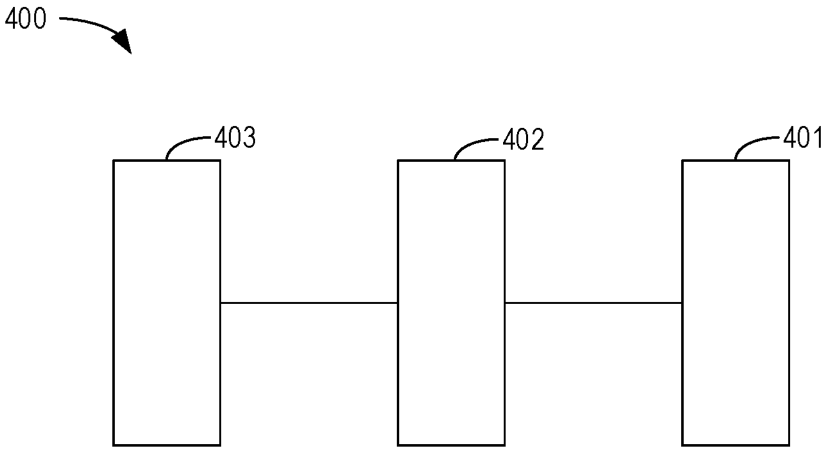
FIG. 6 is a schematic view illustrating a system in accordance with an embodiment of the present disclosure.

Hereinafter, the structure of a system in accordance with an embodiment of the present disclosure will be described in detail with reference to FIG. 6. FIG. 6 is a schematic view illustrating a system in accordance with an embodiment of the present disclosure.

As shown in FIG. 6, the system 400 comprises a measurement module 401, a controller 402, and a communication interface 403. The measurement module 401 comprises at least one ADC module 200 according to any of above embodiments. The measurement module 400 is configured to measure analog signals in Explosion Hazardous Areas. The controller 402 is coupled to the measurement module 401 and configured to issue control signals based on measured analog signals. The communication interface 403 is coupled to the controller 402 and configured to provide a communicate path for the controller 402 and other devices in the system 400.

In other embodiments, the system may comprise other components. The scope of the present disclosure is not intended to be limited in this respect.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

What is claimed is:

1. A protection unit, comprising:
- a first switch unit disposed between a first terminal and an output terminal of the protection unit;
- a second switch unit disposed between a second terminal and a ground of the protection unit; and
- a positive over voltage protection unit coupled to the first terminal, the first switch unit, and the second switch unit, and configured to switch off the first switch unit and the second switch unit when a positive voltage at the first terminal exceeds a positive threshold, wherein:
  - the positive over voltage protection unit including a first PNP transistor, a first NPN transistor, a first MOSFET, and a second MOSFET, and
  - a collector of the first NPN transistor is coupled to a gate of the first MOSFET and a gate of the second MOSFET and an emitter of the first NPN transistor is coupled to a ground of the protection unit.

2. The protection unit according to claim 1, further comprising:
- a negative over voltage protection unit coupled to the first terminal, the second terminal, the first switch unit, and the second switch unit, and configured to switch off the first switch unit and the second switch unit when a negative voltage at the first terminal exceeds a negative threshold.

3. The protection unit according to claim 2, further comprising:
- a hot swap unit coupled to the first switch unit and the second switch unit, and configured to switch off the first switch unit and the second switch unit when the protection unit is hot-inserted into or hot-removed from a board card.

4. The protection unit according to claim 3, further comprising an Electronic Static Discharge (ESD) circuit arranged at the output terminal and comprising a first diode and a second diode connected in series between the ground and a first power supply.

5. The protection unit according to claim 4, wherein the first switch unit comprises a first MOSFET, and the second switch unit comprises a second MOSFET,
- wherein the first MOSFET comprises a source coupled to the output terminal, a gate coupled to the positive over voltage protection unit, and a drain coupled to the first terminal through a first resistor, and
- wherein the second MOSFET comprises a source coupled to the ground, a gate coupled to the positive over voltage protection unit, and a drain coupled to the second terminal.

6. The protection unit according to claim 5, wherein the positive over voltage protection unit further comprises a third diode, a second resistor, and a third resistor,
- wherein an anode of the third diode is coupled to a point between the first resistor and the first terminal, a cathode of the third diode is coupled to a first terminal of the second resistor and a first terminal of the third resistor, a second terminal of the second resistor is coupled to an emitter of the first PNP transistor, a second terminal of the third resistor is coupled to a base of the first PNP transistor and the first power supply, a collector of the first PNP transistor is coupled to a base of the first NPN transistor.

7. The protection unit according to claim 6, wherein the negative over voltage protection unit comprises a fourth diode, a second NPN transistor, a third NPN transistor, a second PNP transistor, a third PNP transistor, a fourth resistor, a fifth resistor, a sixth resistor, a seventh resistor, an eighth resistor, wherein a cathode of the fourth diode is coupled to a point between the first resistor and the first terminal, an anode of the fourth diode is coupled to a first terminal of the fourth resistor and a first terminal of the fifth resistor, a second terminal of the fourth resistor is coupled to a base of the second NPN transistor and a collector of the second PNP transistor, a second terminal of the fifth resistor is coupled to an emitter of the second NPN transistor, a collector of the second NPN transistor is coupled to a first terminal of the sixth resistor and a base of the second PNP transistor, an emitter of the second PNP transistor is coupled to the gate of the first MOSFET and the gate of the second MOSFET, the collector of the second PNP transistor is coupled to the ground, wherein a first terminal of the seventh resistor and a first terminal of the eighth resistor are coupled to the drain of the second MOSFET, a second terminal of the seventh resistor is coupled to an emitter of the third PNP transistor, a second terminal of the eighth resistor is coupled to a base of the third PNP transistor and the first power supply, a collector of the third PNP transistor is coupled to a base of the third NPN transistor, a collector of the third NPN transistor is coupled to the gate of the first MOSFET and the gate of the second MOSFET, an emitter of the third NPN transistor is coupled to the ground.

8. The protection unit according to claim 7, wherein the hot swap unit comprises a switch, a fourth NPN transistor, a ninth resistor, a tenth resistor, and an eleventh resistor, wherein a first terminal of the switch is coupled to the ground, a second terminal of the switch is coupled to a first terminal of the ninth resistor and a first terminal of the tenth resistor, a second terminal of the ninth resistor is coupled to a base of the fourth NPN transistor, a second terminal of the tenth resistor is coupled to a first terminal of the eleventh resistor and a second power supply, a second terminal of the eleventh resistor is coupled to a collector of the fourth NPN transistor, the gate of the first MOSFET and the gate of the second MOSFET, an emitter of the fourth NPN transistor is coupled to the ground, wherein the switch is turned off when the protection unit is being hot inserted or hot removed.

9. The protection unit according to claim 8, wherein the switch is controlled by a mechanical component, and configured to:

be turned off when the mechanical component is positioned at a first position, to allow the protection unit to be inserted into or removed from the board card, and be turned on when the mechanical component is positioned at a second position to prevent the Protection unit from being inserted into or removed from the board card.

10. The protection unit according to claim 1, further comprises a current limiting unit at the first terminal.

11. An ADC module, comprising:

a protection unit according to claim 1; and an ADC IC coupled to an output terminal of the protection unit and the ground and configured to convert an analog signal between the first terminal and the second terminal into a digital signal.

12. A system, comprising:

a measurement module comprising at least one ADC module according to claim 11, the measurement module being configured to measure analog signals in Explosion Hazardous Areas;

a controller coupled to the measurement module and configured to issue control signals based on measured analog signals; and a communication interface coupled to the controller and configured to provide a communicate path for the controller and other devices in the system.

13. The ADC module according to claim 11, wherein the protection unit further comprises:

a negative over voltage protection unit coupled to the first terminal, the second terminal, the first switch unit, and the second switch unit, and configured to switch off the first switch unit and the second switch unit when a negative voltage at the first terminal exceeds a negative threshold.

14. The ADC module according to claim 13, wherein the protection unit further comprises:

a hot swap unit coupled to the first switch unit and the second switch unit, and configured to switch off the first switch unit and the second switch unit when the protection unit is hot-inserted into or hot-removed from a board card.

15. The ADC module according to claim 14, wherein the protection unit further comprises an Electronic Static Discharge (ESD) circuit arranged at the output terminal and comprising a first diode and a second diode connected in series between the ground and a first power supply.

16. The ADC module according to claim 15, wherein the first switch unit comprises a first MOSFET, and the second switch unit comprises a second MOSFET, wherein the first MOSFET comprises a source coupled to the output terminal, a gate coupled to the positive over voltage protection unit, and a drain coupled to the first terminal through a first resistor, and wherein the second MOSFET comprises a source coupled to the ground, a gate coupled to the positive over voltage protection unit, and a drain coupled to the second terminal.

17. The ADC module according to claim 16, wherein the positive over voltage protection unit comprises a third diode, a first PNP transistor, a first NPN transistor, a second resistor, and a third resistor, wherein an anode of the third diode is coupled to a point between the first resistor and the first terminal, a cathode of the third diode is coupled to a first terminal of the second resistor and a first terminal of the third resistor, a second terminal of the second resistor is coupled to an emitter of the first PNP transistor, a second terminal of the third resistor is coupled to a base of the first PNP transistor and the first power supply, a collector of the first PNP transistor is coupled to a base of the first NPN transistor, a collector of the first NPN transistor is coupled to the gate of the first MOSFET and the gate of the second MOSFET, an emitter of the first NPN transistor is coupled to the ground.

18. The ADC module according to claim 17, wherein the negative over voltage protection unit comprises a fourth diode, a second NPN transistor, a third NPN transistor, a second PNP transistor, a third PNP transistor, a fourth resistor, a fifth resistor, a sixth resistor, a seventh resistor, an eighth resistor, wherein a cathode of the fourth diode is coupled to a point between the first resistor and the first terminal, an anode of the fourth diode is coupled to a first terminal of the fourth resistor and a first terminal of the fifth resistor, a second terminal of the fourth resistor is coupled to a base of the second NPN transistor and a collector of the second PNP transistor, a second terminal of the fifth resistor is coupled to an emitter of the second NPN transistor, a collector of the second NPN transistor is coupled to a first terminal of the sixth resistor and a base of the second PNP transistor, an emitter of the second PNP transistor is coupled to the gate of the first MOSFET and the gate of the second MOSFET, the collector of the second PNP transistor is coupled to the ground, wherein a first terminal of the seventh resistor and a first terminal of the eighth resistor are coupled to the drain of the second MOSFET, a second terminal of the seventh resistor is coupled to an emitter of the third PNP transistor, a second terminal of the eighth resistor is coupled to a base of the third PNP transistor and the first power supply, a collector of the third PNP transistor is coupled to a base of the third NPN transistor, a collector of the third NPN transistor is coupled to the gate of the first MOSFET and the gate of the second MOSFET, an emitter of the third NPN transistor is coupled to the ground.

19. The ADC module according to claim 18, wherein the hot swap unit comprises a switch, a fourth NPN transistor, a ninth resistor, a tenth resistor, and an eleventh resistor, wherein a first terminal of the switch is coupled to the ground, a second terminal of the switch is coupled to a first terminal of the ninth resistor and a first terminal of the tenth resistor, a second terminal of the ninth resistor is coupled to a base of the fourth NPN transistor, a second terminal of the tenth resistor is coupled to a first terminal of the eleventh resistor and a second power supply, a second terminal of the eleventh resistor is coupled to a collector of the fourth NPN transistor, the gate of the first MOSFET and the gate of the second MOSFET, an emitter of the fourth NPN transistor is coupled to the ground, wherein the switch is turned off when the protection unit is being hot inserted or hot removed.

20. The ADC module according to claim 19, wherein the switch is controlled by a mechanical component, and configured to:

be turned off when the mechanical component is positioned at a first position, to allow the protection unit to be inserted into or removed from the board card, and be turned on when the mechanical component is positioned at a second position to prevent the Protection unit from being inserted into or removed from the board card.

* * * * *